(12) United States Patent
Venkat et al.

(10) Patent No.: US 6,462,330 B1
(45) Date of Patent: Oct. 8, 2002

(54) COVER WITH INTEGRATED LENS FOR INTEGRATED CHIP OPTICAL SENSOR

(75) Inventors: Suresh Venkat, Woodinville, WA (US); Niel W. Campbell, Bellevue, WA (US); Kevin J. Calmus, Kenmore, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/533,803

(22) Filed: Mar. 24, 2000

(51) Int. Cl.[7] .............................. H01J 40/14; H01J 5/02
(52) U.S. Cl. ........................................ 250/239; 250/216
(58) Field of Search ................................. 250/216, 239

(56) References Cited

U.S. PATENT DOCUMENTS

| | | | | |
|---|---|---|---|---|
| 5,274,456 A | * | 12/1993 | Izumi et al. | 348/335 |
| 5,359,190 A | * | 10/1994 | O'Regan et al. | 250/216 |
| 5,424,531 A | * | 6/1995 | O'Regan et al. | 250/216 |
| 5,783,815 A | * | 7/1998 | Ikeda | 250/208.1 |
| 5,811,799 A | * | 9/1998 | Wu | 350/329 |

\* cited by examiner

*Primary Examiner*—Stephone Allen
*Assistant Examiner*—Eric J Spears
(74) *Attorney, Agent, or Firm*—Banner & Witcoff, Ltd.

(57) ABSTRACT

An integrated lens and aperture plate for an optical sensor equipped integrated chip in which the lens and aperture plate are molded as one piece with the lens at the appropriate location so that the lens aligns with the location of the optical sensor when the aperture plate is assembled to the IC. The lens and sensor are in fixed relation to one another since they are parts of the identical component, the IC, and any registration problems between the lens and sensor are thus eliminated.

9 Claims, 5 Drawing Sheets

COVER WITH INTEGRATED LENS FOR INTEGRATED CHIP OPTICAL SENSOR

TECHNICAL FIELD

This invention relates generally to a tracking lens for an optical sensor carried on an integrated chip (IC). More particularly, the invention provides a tracking lens integrated to the aperture plate of the IC so that the lens registers and aligns with the optical sensor.

BACKGROUND OF THE INVENTION

Integrated chips with optical sensors are typically used for solid state computer input devices which rely on optical tracking to calculate relative displacement values to be communicated to an output converter. These input devices include optical pointing devices such as computer mice and trackballs. An IC with a reflective optical sensor is commercially available from Hewlett-Packard under the designation HDNS-2000, and is typically mounted on a printed circuit board (PCB) which is assembled with a lens plate. The assembly is mounted on a base plate of a housing for the computer input device. The base plate has an aperture operatively registered with and aligned with the magnified light from an LED for the optical sensor. Conventional assemblies of these components have relied on simple registration tabs and mating in the base plate, lens plate and IC mounted PCB to ensure that the aperture plate of the optical sensor, lens and aperture are operatively aligned.

With multiple components which must be assembled and registered together, any misalignment or registration error in such a conventional assembly is compounded and results in an unreliable or even inoperable pointing device. This can be a particular problem during manufacture since these components of pointing devices are most often assembled by hand.

Due to the multiplicity of parts which must be registered and assembled together these conventional assemblies are inefficient to manufacture and suffer from reliability flaws. With currently employed parts and techniques, there is no reliable way of ensuring repeatable and precise registration of the lens and base plate tracking aperture with the aperture plate of the IC optical sensor.

SUMMARY OF THE INVENTION

The present invention overcomes the problems of the prior art by providing a lens integrated into the aperture plate of an optical sensor equipped IC thus structurally integrating the lens to the IC in such a manner as to automatically align and register the lens with the optical sensor. The aperture plate is molded in one-piece with the lens at the appropriate location so that the lens aligns with the location of the optical sensor when the aperture plate is assembled to the IC. The lens and sensor are in fixed relation to one another since they are parts of the identical component, the IC, and any registration problems between the lens and sensor are eliminated.

The integrated lens is molded into the aperture plate. In order to ensure proper focus, the lens is spaced away from the optical sensor a predetermined distance. To accommodate the proper distance, the lens is molded at the end of an integrally molded column. The column includes structural features for enhanced strength and for proper positioning of the lens relative to the base plate of the housing. The column has two horizontal portions, a frusto-conical portion adjacent to the aperture plate and a cylindrical portion containing the integral lens. Molded within the column are ribs or vanes which strengthen the column. The tips of the ribs or vanes extend beyond the lens to act as stops which abut against the base plate housing. The portions of the ribs or vanes which extend beyond the lens also help ensure that the lens is an appropriate distance from the surface being read by the optical sensor.

In a pointing device assembly there are no special configurations of the PCB necessary to use the integrated aperture plate and lens. The optical sensor IC outfitted with the integrated aperture plate and lens is simply mounted to the PCB in the usual manner. By physically integrating the IC sensor and lens in this manner, several registration and alignment issues during the assembly process are nullified, and precision and repeatability are enhanced.

DETAILED DESCRIPTION OF THE INVENTION

Figure 1:
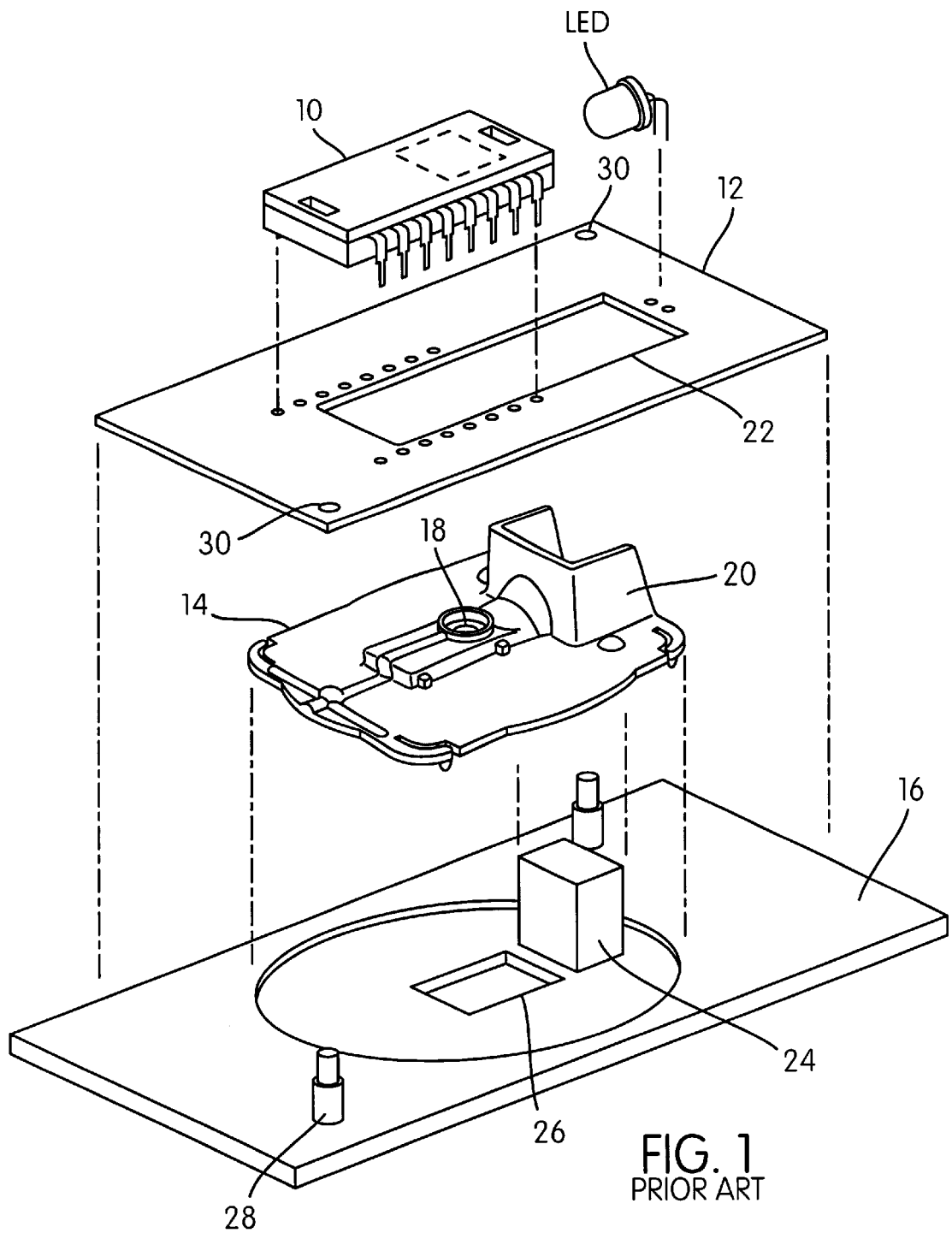
FIG. 1 is an exploded view of the components of a conventional optical sensor IC and aperture plate assembly.

A conventional tracking lens and optical sensor assembly is illustrated in FIG. 1 in which a light source such as an LED is operatively assembled with an optical sensor IC 10 and PCB 12 shown aligned with a lens plate 14 and base plate 16. The LED is typically coupled to the IC by a clip or other means. The aperture plate of IC 10 is oriented downward in FIG. 1 so that the optical sensor will be registered with lens 18 of lens plate 14 once the IC is mounted to the PCB. The registration mechanism between lens 18 and the optical sensor comprises a rectangular walled opening 20 with at least opposing walls received in assembly opening 22 of the PCB. Registration of lens plate 14 to base plate 16 is achieved by projecting registration column 24 through walled opening 20. The simple registration guides such as walled opening 20, assembly opening 22 of the PCB and column 24 of the base plate are arranged so that the optical sensor aligns with lens 18 and tracking aperture 26 of base plate 16. The PCB is registered with base plate 16 by alignment posts 28 on the base plate being received in alignment apertures 30 of the PCB. None of the critical components are affixed relative to another, and the dimensional tolerances necessitated by conventional assembly using these registration guides results in some "play" between the components. These simple geometric registration constraints prevent precise and repeatable alignment of the critical components such as the sensor, lens and tracking aperture.

Figure 2:
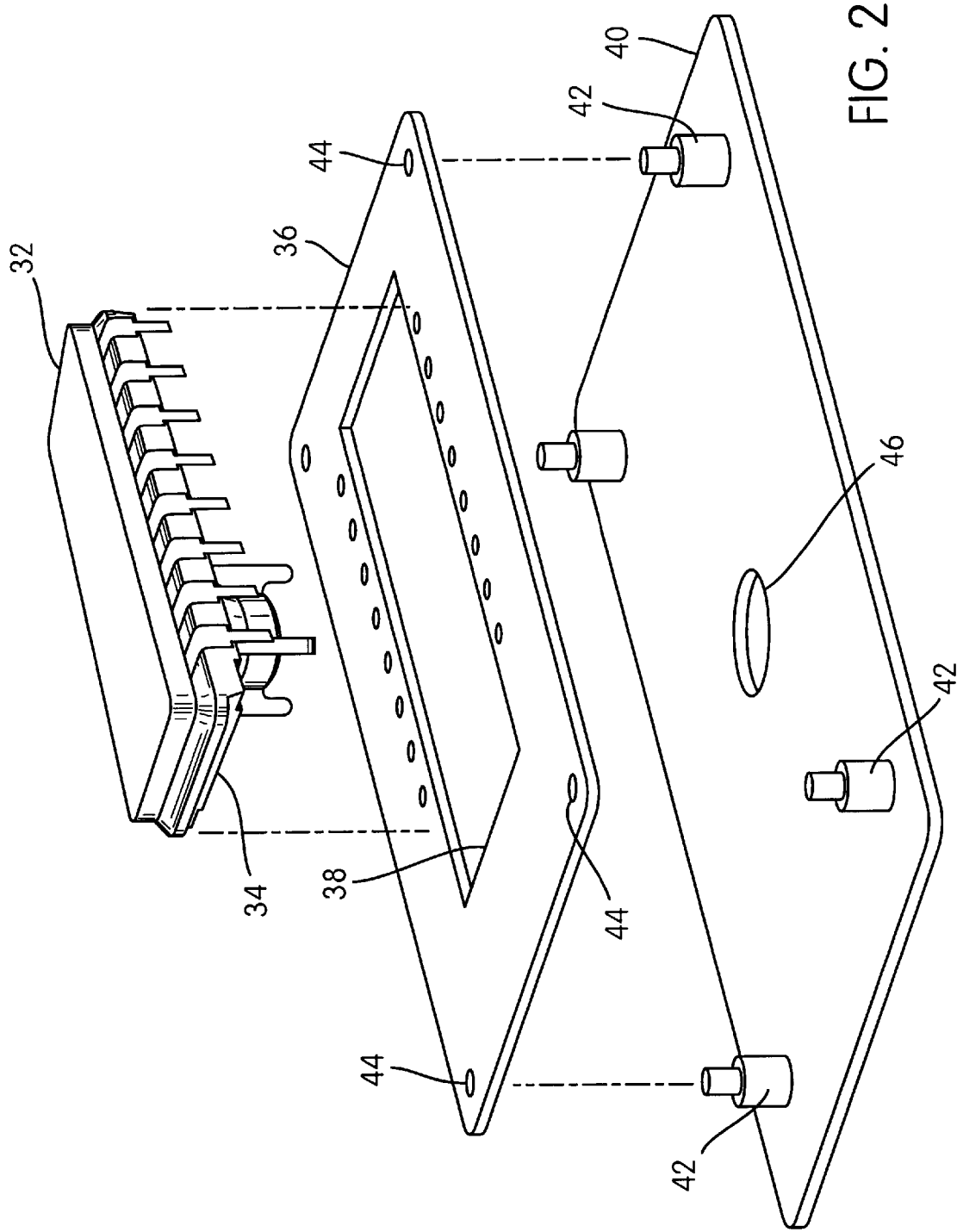
FIG. 2 is an exploded view of an exemplary optical sensor IC assembly shown with the integrated aperture plate and lens in accordance with the present invention.
Figure 3:
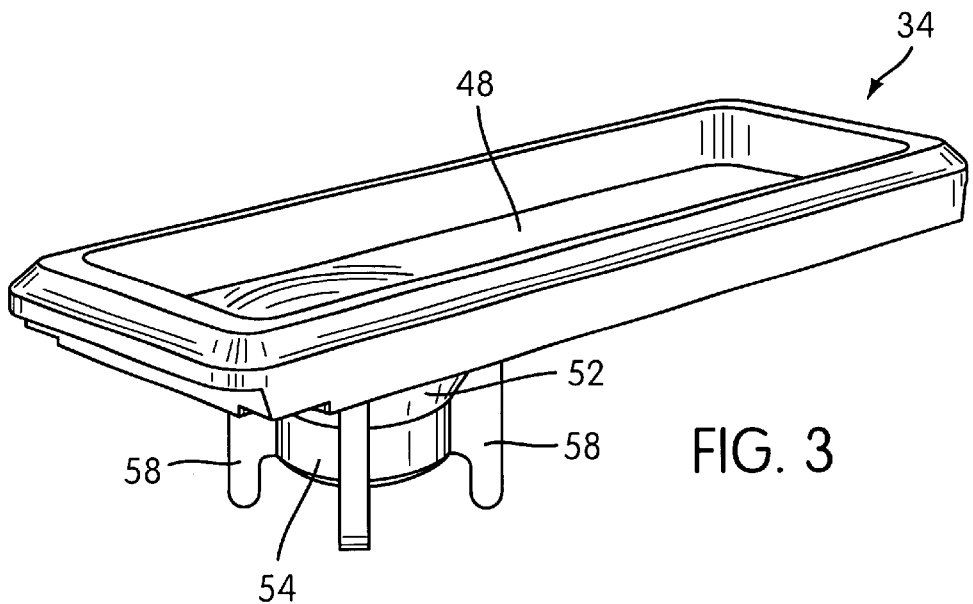
FIG. 3 is a perspective view of the integrated aperture plate.
Figure 4:
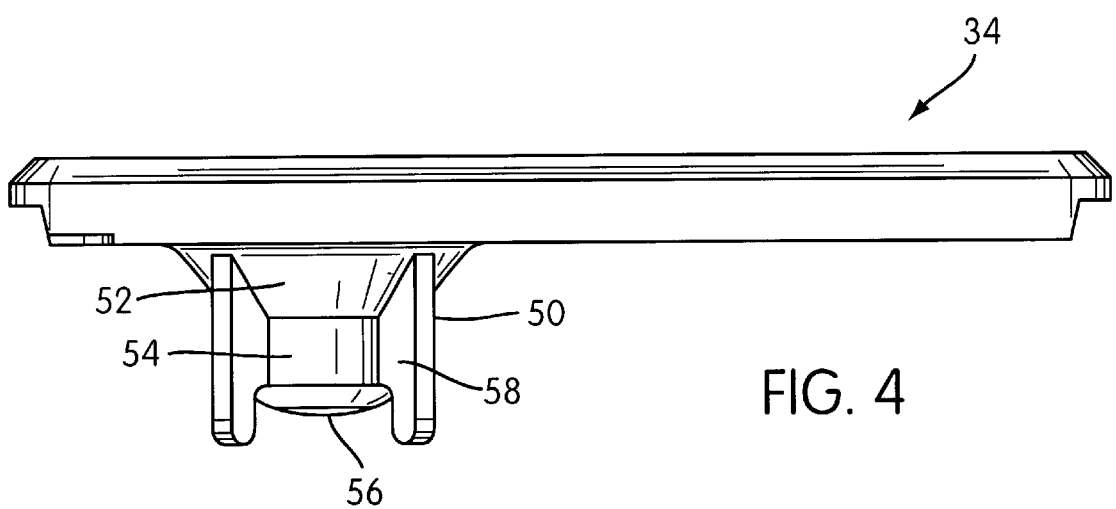
FIG. 4 is a side elevational view of the integrated aperture plate of FIG. 3.
Figure 5:
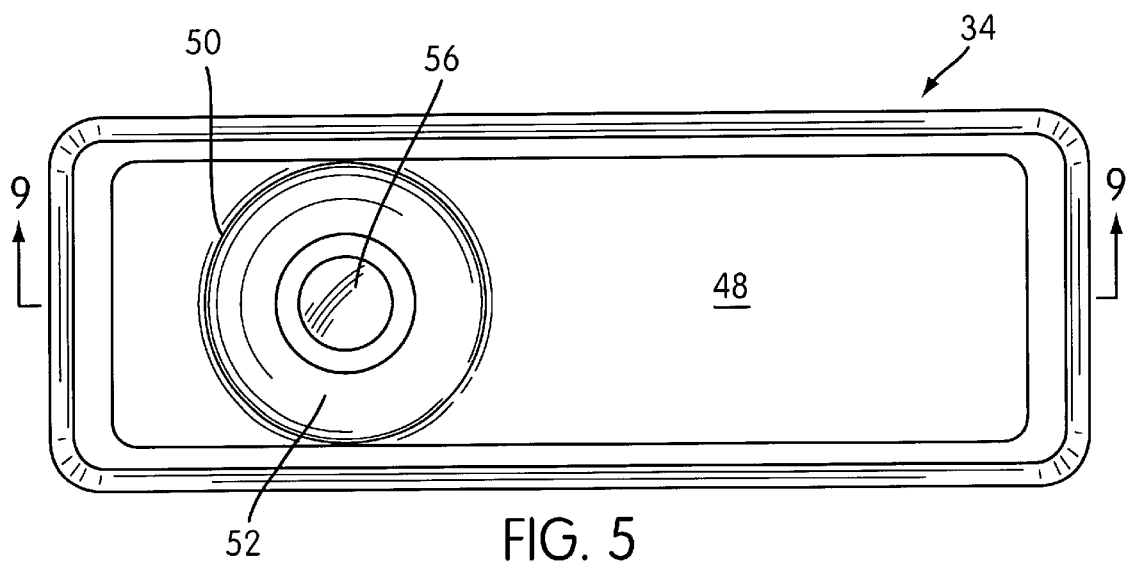
FIG. 5 is a top plan view of the integrated aperture plate of FIG. 3.
Figure 6:
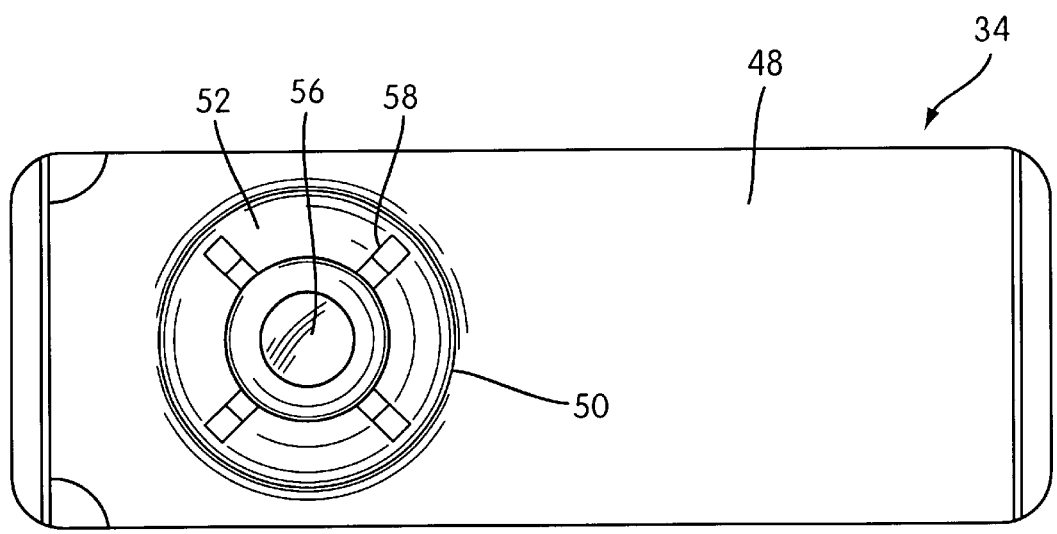
FIG. 6 is a bottom plan view of the integrated aperture plate of FIG. 3.
Figure 7:
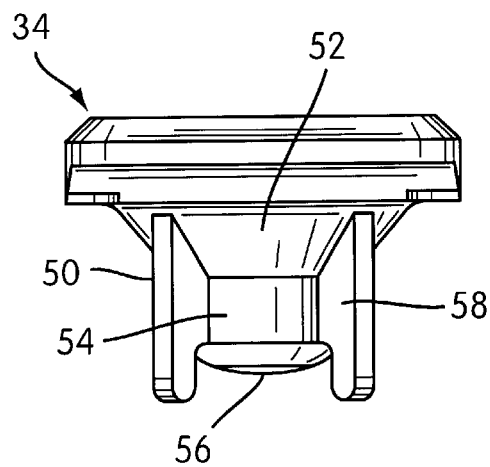
FIG. 7 is an end elevational view of one end the integrated aperture plate of FIG. 3.
Figure 8:
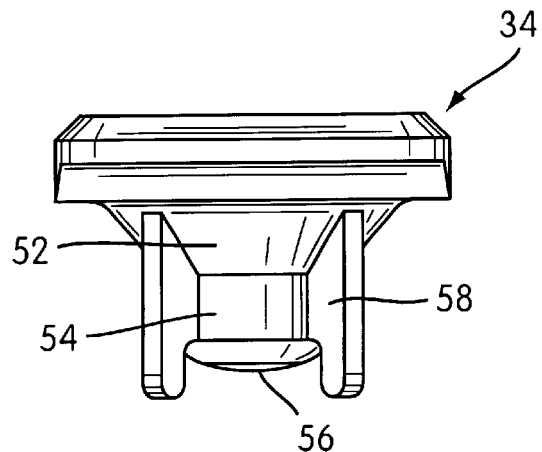
FIG. 8 is an end elevational view of the other end of the integrated aperture plate of FIG. 3.
Figure 9:
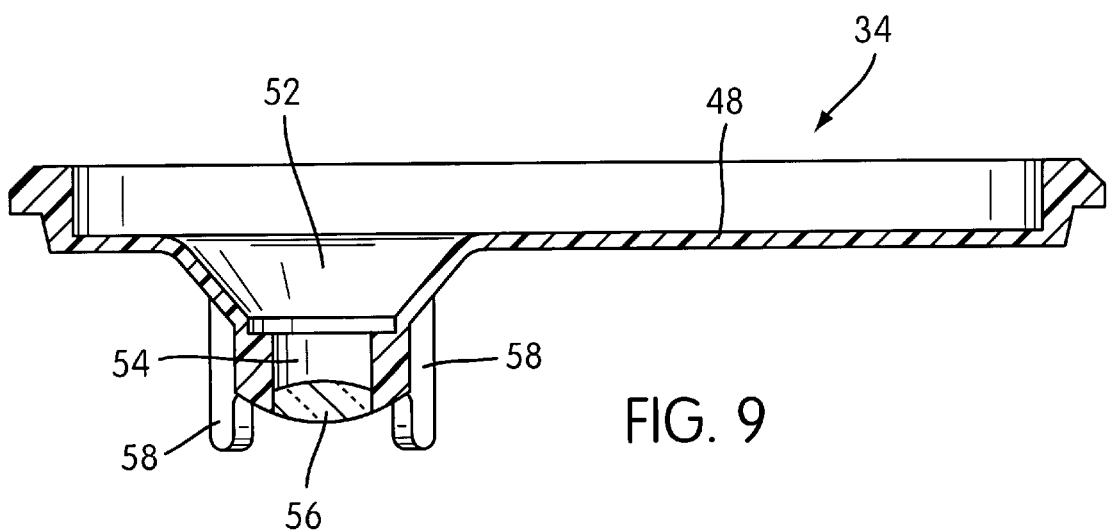
FIG. 9 is cross-sectional view taken along line 9—9 of FIG. 5.

The integrated aperture plate and lens of the present invention eliminates the geometric registration guides of the prior art and all of the problems associated with dimensional tolerances between the sensor and the lens. FIG. 2 is an exploded assembly view of an IC 32 equipped with an integrated aperture plate 34 shown as the IC would be mounted on a PCB 36 through assembly opening 38. Also illustrated is a base plate 40 with alignment posts 42 arranged to be received in alignment apertures 44 of the PCB. Base plate 40 has a tracking aperture 46.

Reference is made to FIGS. 3–9 for detailed views of the integrated aperture plate itself prior to attachment to the IC. For the sake of convenient explanation, when directional descriptions are used this in specification, they are made with reference to the orientation of the components as shown in FIG. 2 which is for a typical optical mouse. However, the actual orientation of the components may vary depending on the type of pointing device, or in various stages of assembly and manufacture.

Integrated aperture plate 34 has a plate-like cover 48 which protects the underside of the IC. Integral with cover 48 is a column 50 having a frusto-conical portion 52 adjacent the cover and a cylindrical portion 54 extending from the frusto-conical portion. At the end of cylindrical portion 54 is the integrally formed lens 56. The length of column 50 along with the thickness of the aperture plate determine the distance between the lens and the optical sensor of the IC. The length of column 50 can be adjusted to provide the optical focusing distance.

To enhance the structural integrity of column 50, integral ribs or vanes 58 are formed radially on the column. Vanes 58 extend beyond lens 56 and have integral bearing surfaces 60 at their tips to abut against and resting upon the base plate of the housing adjacent the tracking aperture. Besides protecting the lens, vanes 58 ensure that lens 56 is spaced an appropriate distance from the surface to be read by the optical sensor.

Column 50 is positioned on the aperture plate so that its center line is aligned with the center of the optical sensor of the IC. This arrangement ensures that lens 56 is perfectly aligned with the optical sensor to provide optimal view area and range. Aperture plate 34 is precision designed to ensure that lens 56 is aligned with the optical sensor on IC 32 at all times. This physical integration of the lens and optical sensor eliminates all of the registration problems associated with the conventional multi-part assemblies.

It will be apparent to one of skill in the art that by physically integrating the aperture plate and lens together in this manner, all potential registration problems between the IC and the lens are eliminated. The critical alignment of lens 56 to the IC sensor is achieved in the manufacture of the IC itself and the alignment is not affected by further assembly.

As seen in FIG. 2, once the integrated aperture plate equipped IC is mounted the PCB, the PCB is assembled to base plate 40 with the lens and sensor aligned with tracking aperture 46. An LED (not shown) is placed in an appropriate position relative to the other components of the assembly. Normally tracking aperture 46 is relatively large so that there is sufficient clearance around the lens and LED, and no registration problems are caused by misalignment of the tracking aperture.

Although the integrated aperture plate and lens has been illustrated with four reinforcement vanes, different numbers and configurations of vanes are possible to achieve the function of the vanes in the described embodiment and are contemplated to be within the scope of the invention.

Integrated aperture plate and lens 34 eliminates multiple registration problems of the prior art by affixing the structural relationship between the IC sensor and lens 56. The dimensions of the IC and position of the sensor being known, precision engineering of the aperture plate and lens enables automatic, repeatable alignment of the sensor and lens. Employing the integrated aperture plate makes production more efficient and enhances reliability of the devices.

Thus has been described an integrated aperture plate and lens for an optical sensor equipped IC for automatic and precise registration of the lens and sensor which is not affected by other assembly steps. The foregoing explanation includes many variations and embodiments, and the invention is not intended to be limited to the specific details disclosed herein, but only by the claims appended hereto.

What is claimed is:

1. An integrated aperture plate for an optical sensor equipped integrated chip, said aperture plate comprising:
    a cover portion for protecting the integrated chip including a solid, planar area adapted to form the underside of the integrated chip;
    a column formed with said cover and extending substantially perpendicular to the planar area of said cover; and
    an integral lens provided at an end of said column, said column and lens adapted to be aligned with the sensor of the chip.

2. The integrated aperture plate of claim 1 wherein said column comprises a frusto-conical portion adjacent said cover and a cylindrical portion containing said lens.

3. The integrated aperture plate of claim 2 further comprising a reinforcing vane extending radially from said column for reinforcing said column.

4. The integrated aperture plate of claim 3 wherein said vane has a free end extending past said lens to provide an abutment surface for said aperture plate.

5. An optical sensor equipped integrated chip comprising:
    an integrated chip having an optical sensor disposed on one side; and
    an aperture plate attached to said integrated chip forming a cover on the same side as said optical sensor, said aperture plate comprising a planar cover portion for protecting the integrated chip and optical sensor, a column formed with said cover and extending substantially perpendicular to said planar cover portion, and an integral lens provided at an end of said column, said column and lens adapted to be aligned with said optical sensor.

6. The integrated chip of claim 5 wherein said column comprises a frusto-conical portion adjacent said cover.

7. The integrated chip of claim 5 wherein said column comprises a cylindrical portion containing said lens.

8. The integrated chip of claim 5 further comprising a reinforcing vane extending radially from said column for reinforcing said column.

9. The integrated chip of claim 8 wherein said vane has a free end extending past said lens to provide an abutment surface for said aperture plate.

* * * * *